(12) United States Patent
Chiarotto et al.

(10) Patent No.: US 12,305,271 B2
(45) Date of Patent: May 20, 2025

(54) ITEM COMPRISING AN ORGANIC-INORGANIC LAYER WITH A LOW REFRACTIVE INDEX

(71) Applicants: ESSILOR INTERNATIONAL, Charenton-le-pont (FR); CORPORATION DE L'ECOLE POLYTECHNIQUE DE MONTREAL, Montreal (CA)

(72) Inventors: Sébastien Chiarotto, Charenton-le-pont (FR); Jolanta Klemberg-Sapieha, Montreal (CA); Martin Caron, Montreal (CA)

(73) Assignees: Essilor International, Charenton-le-pont (FR); Corporation de l'Ecole Polytechnique de Montréal, Montreal (CA)

( * ) Notice: Subject to any disclaimer, the term of this patent is extended or adjusted under 35 U.S.C. 154(b) by 0 days.

(21) Appl. No.: 17/367,928

(22) Filed: Jul. 6, 2021

(65) Prior Publication Data
US 2021/0405261 A1    Dec. 30, 2021

Related U.S. Application Data

(63) Continuation of application No. 16/063,545, filed as application No. PCT/FR2016/053525 on Dec. 16, 2016, now abandoned.

(30) Foreign Application Priority Data

Dec. 18, 2015   (FR) ...................... 1562857

(51) Int. Cl.
*C23C 14/00*   (2006.01)
*C09D 183/04*   (2006.01)
(Continued)

(52) U.S. Cl.
CPC ........ *C23C 14/0031* (2013.01); *C09D 183/04* (2013.01); *C23C 14/10* (2013.01);
(Continued)

(58) Field of Classification Search
CPC ..... G02B 1/111; C23C 14/0031; C23C 14/24; C03C 17/34; C03C 17/3411; C03C 17/3429; C03C 17/3452
See application file for complete search history.

(56) References Cited

U.S. PATENT DOCUMENTS 4,783,373 A * 11/1988 Baumeister ............. C23C 14/06
                                                                    359/359
5,508,368 A    4/1996 Knapp et al.
(Continued)

FOREIGN PATENT DOCUMENTS

CN    1414398     4/2003
EP    0402473     12/1990
(Continued)

OTHER PUBLICATIONS

Allen et al., "Antireflection coatings for plastic optics" *J. Phys. D: Appl.* 1988, 21, S92-S95.
(Continued)

*Primary Examiner* — Michael P Wieczorek
(74) *Attorney, Agent, or Firm* — Norton Rose Fulbright US LLP

(57) ABSTRACT

The invention relates to an article comprising a substrate having at least one main surface coated with a layer L of a material M obtained by vacuum deposition, by co-evaporation, of at least one metallic compound A chosen from alkaline-earth metal fluorides and of at least one organic compound B, the material M having a refractive index at the wavelength of 632.8 nm ranging from 1.38 to 1.47. According to the invention:

(Continued)

the organic compound B comprises an organosilicon compound or a mixture of organosilicon compounds; and the deposition of the compound B, in gaseous form, is carried out in the presence of an ion bombardment.

17 Claims, 1 Drawing Sheet

(51) Int. Cl.
    *C23C 14/10*     (2006.01)
    *C23C 14/12*     (2006.01)
    *C23C 14/24*     (2006.01)
    *G02B 1/111*     (2015.01)
    *G02B 1/115*     (2015.01)

(52) U.S. Cl.
CPC ............ *C23C 14/12* (2013.01); *C23C 14/24* (2013.01); *G02B 1/111* (2013.01); *G02B 1/115* (2013.01)

(56) References Cited

U.S. PATENT DOCUMENTS

| | | | |
|---|---|---|---|
| 6,183,872 B1 | 2/2001 | Tanaka et al. | |
| 6,387,517 B1 | 5/2002 | Belleville et al. | |
| 6,919,134 B2* | 7/2005 | Mitsuishi | G02B 1/111 427/255.6 |
| 2006/0023311 A1* | 2/2006 | Scherer | C23C 14/10 359/603 |
| 2014/0354945 A1* | 12/2014 | Martinu | G02B 1/14 351/159.62 |
| 2016/0216409 A1 | 7/2016 | Schulz et al. | |

FOREIGN PATENT DOCUMENTS

| | | |
|---|---|---|
| EP | 0614957 | 9/1994 |
| EP | 1123905 | 8/2001 |
| JP | H03-143975 | 6/1991 |
| JP | 2005-187936 | 7/2005 |
| JP | 2005/257840 | 9/2005 |
| JP | 2009/179866 | 8/2009 |
| WO | WO 1999/49097 | 9/1999 |
| WO | WO 2005/024087 | 3/2005 |
| WO | WO 2008/001011 | 1/2008 |
| WO | WO 2008/015364 | 2/2008 |
| WO | WO 2008/062142 | 5/2008 |
| WO | WO 2009/047426 | 4/2009 |
| WO | WO 2010/109154 | 9/2010 |
| WO | WO 2011/080472 | 7/2011 |
| WO | WO 2013/098531 | 7/2013 |

OTHER PUBLICATIONS

Dumas et al. "Optical properties of magnesium fluoride thin films produced by argon ion-beam assisted deposition" *Journal of Vacuum Science & Technology A* 2002, 20(1), 102-105.

International Search Report and Written Opinion issued in International Patent Application No. PCT/FR2016/053525, dated Feb. 7, 2017.

Kennemore et al. "Ion beam processing for coating MgF2 onto ambient temperature substrates" *Applied Optics* 1984, 23(20), 3608-3611.

Musket et al., "Enhanced adhesion at oxide/oxide interfaces by ion beam stitching" *Appl. Phys. Lett.* 1988, 52(5), 410-412.

Office Action Issued in Corresponding Chinese Patent Application No. 201680069889.6, dated Dec. 10, 2019.

Saxe, Steven Gary. *Ion-Induced Processes in Optical Coatings.* 1985, University of Arizona, PhD thesis.

Schultz, "Review of modern techniques to generate antireflective properties on thermoplastic polymers" *Applied Optics* 2006, 45(7), 1608-1618.

Sun, Fangjin *Principles and Azimuth Directional Transfer*, China Aerospace Press, 2014. (English Translation of Relevant Sections).

* cited by examiner

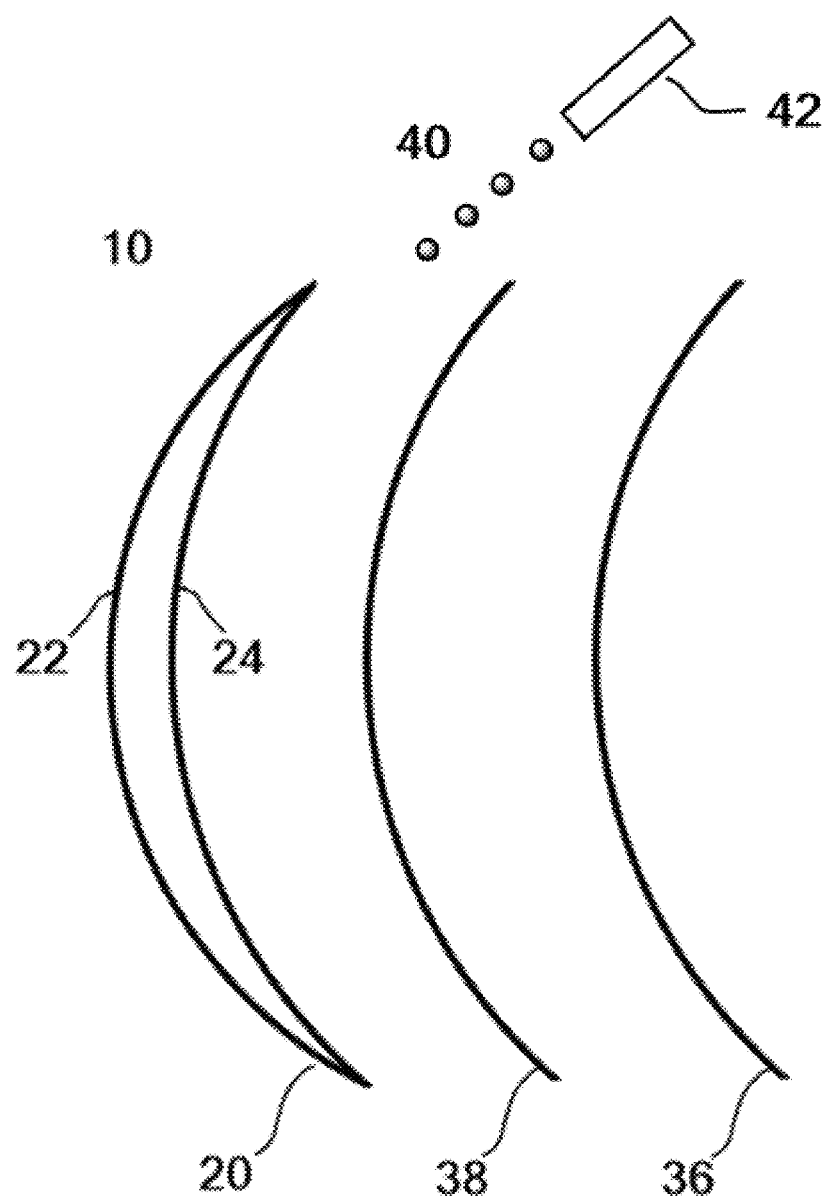

ITEM COMPRISING AN ORGANIC-INORGANIC LAYER WITH A LOW REFRACTIVE INDEX

CROSS-REFERENCE TO RELATED APPLICATIONS

This application is a continuation of U.S. application Ser. No. 16/063,545 filed 18 Jun. 2018, which is a national phase application under 35 U.S.C. § 371 of International Application No. PCT/FR2016/053525 filed 16 Dec. 2016, which claims priority to French Application No. 1562857 filed 18 Dec. 2015. The entire contents of each of the above-referenced disclosures is specifically incorporated by reference herein without disclaimer.

BACKGROUND OF THE INVENTION

The present invention relates generally to an article, preferably an optical article, in particular an ophthalmic lens, possessing a layer of organic/inorganic nature and of low refractive index, and also to a process for the preparation of such an article.

It is known to treat ophthalmic lenses with interference coatings.

In particular, it is known to treat ophthalmic lenses, whether they are mineral or organic, so as to prevent the formation of parasitic reflections which are a nuisance to the wearer of the lens and the people they are interacting with. The lens is then provided with a single-layer or multilayer antireflective coating, generally made of mineral material, which has, in the second case, an alternation of layers of high refractive index and of low refractive index.

A reflective coating produces the reverse effect, that is to say that it increases the reflection of the light rays. Such a type of coating is used, for example, to obtain a mirror effect in sunglass lenses.

It is also known to use interference coatings to filter certain wavelengths that are harmful to the eye, for example wavelengths in the blue range. It which also possible to use antireflective coatings which also have a filtering function in one or more selected wavelength ranges.

During the trimming and fitting of a lens at an optician's practice, the lens undergoes mechanical deformations which can produce cracks in the mineral reflective or antireflective interference coatings, in particular when the operation is not carried out with care. Similarly, thermal stresses (heating of the frame) can produce cracks in the interference coating. Depending on the number and the size of the cracks, the latter can interfere with the field of view of the wearer and prevent the lens from being sold. Furthermore, while the treated organic lenses are being worn, scratches can appear. In mineral interference coatings, some scratches lead to cracking, making the scratches more visible because of scattering of light.

One objective of the invention is to obtain a coating, in particular an interference coating and especially an antireflective coating, which has improved thermomechanical properties, while retaining a low refractive index, preferably with good adhesion properties. The invention is targeted in particular at articles possessing an improved critical temperature, that is to say exhibiting a good resistance to cracking when they are subjected to an increase in temperature. Another objective of the invention is to provide a process for the manufacture of an interference coating which is simple, easy to carry out and reproducible.

It is also known to deposit thin organic/inorganic layers by the liquid route. This deposition technique exhibits disadvantages, such as the difficulty of spreading and of polymerizing the layers without creating cracks on organic substrates, and the duration of the process, in particular when other coatings have to be deposited on these layers.

Application WO-2005/024087, in the name of the applicant, describes a process for carrying out an antireflective treatment on an optical substrate that comprises the physical vapor deposition, under vacuum, of a low-refractive-index layer comprising silica or magnesium fluoride and a fluoropolymer. The layer obtained has improved adhesion to the subjacent layer of an antireflective stack deposited on an optical substrate or on the optical substrate itself. The deposition is not carried out with ion assistance. Moreover, it is not envisaged to use an organosilicon compound instead of the fluoropolymer.

Application EP-1 123 905 describes a process for forming an optical composite film of high or low refractive index which consists in depositing an inorganic material, in particular $SiO_2$ and $MgF_2$ (low index materials) by reactive ion plating in an atmosphere into which gaseous substances containing a fluorocarbon are introduced. The atmosphere may further contain an organosilicon compound. Ions of the inorganic material and gaseous substances are directly formed in the chamber by application of a radiofrequency. The presence of an organosilicon compound in the atmosphere has the result of increasing the stability of the composite film obtained. The fluorocarbon is an essential constituent of the process.

There is still a need for novel materials for the low-refractive-index layers of interference stacks that have improved thermomechanical properties while having a low refractive index.

The articles prepared should preferably have a good resistance to being dipped in hot water followed by a mechanical stressing of the surface, and be free of optical defects.

Thus, the inventors have developed a transparent low-refractive-index layer material which can be used in interference filters, making it possible to meet the objectives set. This material can be used to replace conventional low-refractive-index materials, such as silica and magnesium fluoride, in interference coatings.

According to the invention, the layer of low-refractive-index material is formed by ion-beam-assisted vacuum deposition, the ion beam preferably resulting from an ion gun, of activated species, in gaseous form, obtained from a precursor material of organic nature and from a precursor material of inorganic nature. It possesses improved thermomechanical properties while exhibiting a low refractive index and a high transparency.

BRIEF DESCRIPTION OF THE DRAWINGS

The following parts of the description are made in reference with the enclosed FIG. 1 which represents an illustration of an embodiment of an article to the invention that includes a substrate with at least one main surface, and a layer L onto which is deposited a thin-organic-inorganic layer with the organic component of the organic-inorganic layer having been deposited in the presence of an ion bombardment.

DETAILED DESCRIPTION

The objectives set are therefore achieved according to the invention by an article 10 comprising a substrate 20 having at least one main surface 22, 24 coated with a layer L 38 of a material M obtained by vacuum deposition, by co-evaporation, of at least one metallic compound A (i.e.: precursor material of inorganic nature) chosen from alkaline-earth metal fluorides and of at least one organic compound B (precursor material of organic nature), the material M having a refractive index at the wavelength of 632.8 nm ranging from 1.38 to 1.45, characterized in that:

the organic compound B is an organosilicon compound or a mixture of organosilicon compounds, and the deposition of the compound B, in gaseous form, is carried out in the presence of an ion bombardment 40, preferably using an ion gun 42.

Preferably, the organic compound B does not comprise any fluorocarbon. Better still, the organic compound B is formed solely of an organosilicon compound or a mixture of organosilicon compounds.

Preferably, the ion bombardment of the organosilicon compound B is carried out in the presence of a gas chosen from oxygen, noble gases, nitrogen and a mixture of two or more of these gases, in particular oxygen or a mixture of oxygen and argon and/or nitrogen. More preferably, the co-evaporation of the metallic compound A is carried out using an electron gun.

In one recommended embodiment of the invention, when the layer L 38, constitutes the layer of an interference coating furthest from the substrate, a thin organic-inorganic layer 36 with a thickness of 1 to 20 nm is deposited on this layer L 38, this organic-inorganic layer 36 being obtained by deposition of an organosilicon compound or a mixture of organosilicon compounds in gaseous form, in the presence of an ion bombardment 40 and in the absence of a mineral precursor.

Preferably, this thin organic-inorganic layer 36 is obtained solely by deposition of an organosilicon compound or a mixture of organosilicon compounds.

The deposition of such a thin organic-inorganic layer 36 on the layer L 38, surprisingly, increases the adhesion of the layer L 38 to the interference coating.

The organic-inorganic compounds used for this thin organic-inorganic layer 36 are the same as those that can be used for the formation of the layer L 38. The deposition conditions of this thin organic-inorganic layer 36 are also similar to those used for the deposition of the layer L 38 according to the invention. However, the deposition of the thin organic-inorganic layer 36 is carried out in the absence of any mineral precursor, such as silica, metal oxides and halides, especially metal fluorides and, in particular, $SiO_2$ and $MgF_2$. Preferably, the deposition of the thin organic-inorganic layer 36 is obtained by deposition of the organosilicon compounds alone.

The combination of the layer L 38 and of the thin organic-inorganic layer 36 has a refractive index ranging from 1.38 to 1.47 at the wavelength of 632.8 mm.

The invention also relates to a process for the manufacture of such an article 10, comprising at least the following stages:

supplying an article comprising a substrate 20 having at least one main surface 22, 24, depositing, on said main surface 22, 24 of the substrate 20, a layer L 38 of a material having a refractive index ranging from 1.38 to 1.47 at the wavelength of 632.8 nm and, optionally, the deposition on this layer L 38 of a thin organic-inorganic layer 36 with a thickness of 1 to 20 nm, recovering an article comprising a substrate 20 having a main surface 22, 24 coated with a layer L 38, said layer L 38 having been obtained by vacuum deposition, by co-evaporation, of at least one metallic compound A chosen from alkaline-earth metal fluorides and of a compound B comprising at least one organosilicon compound, the deposition of the compound B, in gaseous form, being carried out in the presence of an ion bombardment 40, preferably using an ion gun 42, and the deposition of the optional thin organic-inorganic layer 36 being obtained by deposition of an organosilicon compound or a mixture of organosilicon compounds, in the absence of mineral precursor. Preferably, the co-evaporation of the metallic compound A is carried out using an electron gun.

In the present application, when an article comprises one or more coatings at its surface, the expression "to deposit a layer or a coating on the article" means that a layer or a coating is deposited on the uncovered (exposed) surface of the external coating of the article, that is to say its coating furthest from the substrate.

A coating which is "on" a substrate or which has been deposited "on" a substrate is defined as a coating which (i) is positioned above the substrate, (ii) is not necessarily in contact with the substrate (although it preferably is), that is to say that one or more intermediate coatings can be positioned between the substrate and the coating in question, and (iii) does not necessarily completely cover the substrate (although it preferably covers it). When "a layer 1 is located under a layer 2", it will be understood that the layer 2 is further from the substrate than the layer 1.

The article prepared according to the invention comprises a substrate, preferably a transparent substrate, having front and back main faces 22, 24, at least one of said main faces, 24, and preferably both main faces comprising at least one layer L 38, which can be incorporated in an interference coating.

The "back face" 24 of the substrate (the back face generally being concave) is understood to mean the face which, when the article is being used, is closest to the eye of the wearer. Conversely, the "front face" 22 of the substrate (the front face generally being convex) is understood to mean the face which, when the article is being used, is furthest from the eye of the wearer.

Although the article according to the invention can be any article, such as a screen, a glazing unit, a pair of protective glasses which can be used in particular in a working environment, a mirror or an article used in electronics, it preferably constitutes an optical article, better still an optical lens and even better still an ophthalmic lens, for a pair of glasses, or an optical or ophthalmic lens blank, such as a semi-finished optical lens, in particular a glasses lens. The lens may have an optical, progressive or multifocal power, or have no power (piano). The lens can be a polarized or tinted lens or a photochromic or electrochromic lens. Preferably, the ophthalmic lens according to the invention exhibits a high transmission.

The layer L 38 according to the invention can be formed on at least one of the main faces of a bare substrate, that is to say an uncoated substrate, or on at least one of the main faces of a substrate already coated with one or more functional coatings.

The substrate of the article according to the invention is preferably an organic lens, for example made of thermoplastic or thermosetting plastic. This substrate can be chosen from the substrates mentioned in the application WO-2008/062142 or WO 2008/109154, for example a substrate obtained by (co)polymerization of diethylene glycol bis (allyl carbonate), a substrate made of poly(thio)urethane, a substrate made of polyacrylate, a substrate made of polyepisulfide or a substrate made of (thermoplastic) bisphenol A polycarbonate, denoted PC, or a substrate made of PMMA (polymethyl methacrylate).

Before the layer L 38 is deposited on the substrate, which is optionally coated, for example with an abrasion-resistant and/or scratch-resistant coating, it is common to subject the surface of said optionally coated substrate to a physical or chemical activation treatment intended to increase the adhesion of the layer L 38. This pretreatment is generally carried out under vacuum. It may be a bombardment with energetic and/or reactive species, for example a beam of ions (Ion Pre-Cleaning or IPC) or a beam of electrons, a corona discharge treatment, a glow discharge treatment, a UV treatment or a treatment by vacuum plasma, generally an oxygen or argon plasma. It may also be an acidic or basic surface treatment and/or a surface treatment with solvents (water or organic solvent). Several of these treatments can be combined. By virtue of these cleaning treatments, the cleanliness and the reactivity of the surface of the substrate are optimized.

Energetic (and/or reactive) species are understood in particular to mean ionic species having an energy preferably ranging from 1 to 300 eV, preferentially from 1 to 150 eV, better still from 10 to 150 eV and even better still from 40 to 150 eV. The energetic species may be chemical species, such as ions or radicals, or species such as photons or electrons.

The preferred pre-treatment of the surface of the substrate is an ion bombardment treatment 40 carried out by means of an ion gun 42, the ions being particles consisting of gas atoms from which one or more electron(s) have been stripped. Use is preferably made, as ionized gas, of argon ($Ar^+$ ions), but also of oxygen or of mixtures thereof, under an acceleration voltage generally ranging from 50 to 200 V, a current density generally of between 10 and 100 $\mu A/cm^2$ on the activated surface, and generally under a residual pressure in the vacuum chamber which can range from $8\times10^{-5}$ mbar to $5\times10^{-4}$ mbar.

The article according to the invention comprises a layer L 38, which preferably constitutes a low-index layer of a multilayer interference coating, which is in particular antireflective. Preferably, the external layer of such a multilayer (interference) coating, that is to say the layer of the (interference) coating furthest from the substrate in the order of stacking, is a layer L 38 according to the invention. In a preferred embodiment, the layer L 38 constitutes the last layer of the multilayer (interference) coating in the order of stacking and is found directly in contact with a subjacent high-refractive-index layer.

The layer L 38 or said multilayer (interference) coating is preferably formed on an abrasion-resistant coating. The preferred abrasion-resistant coatings are coatings based on epoxysilane hydrolysates comprising at least two, preferably at least three, hydrolysable groups bonded to the silicon atom. The preferred hydrolysable groups are alkoxysilane groups.

The interference coating can be any interference coating conventionally used in the field of optics, in particular of ophthalmic optics, except for the fact that it comprises a layer L 38 according to the invention. The interference coating can be, without limitation, an antireflective coating or a reflective (mirror) coating, preferably an antireflective coating.

An antireflective coating is defined as a coating, deposited at the surface of an article, which improves the antireflective properties of the final article. It makes it possible to reduce the reflection of the light at the article-air interface over a relatively broad portion of the visible spectrum.

As is well known, interference coatings, preferably antireflective coatings, conventionally comprise a single-layer or multilayer stack of dielectric materials. These are preferably multilayer coatings, comprising high-refractive-index (HI) layers and low-refractive-index (LI) layers.

In the present application, a layer of the interference coating is known as a high-refractive-index layer when its refractive index is greater than 1.55, preferably greater than or equal to 1.6, better still greater than or equal to 1.8 and even better still greater than or equal to 2.0. A layer of an interference coating is known as a low-refractive-index layer when its refractive index is less than or equal to 1.55, preferably less than or equal to 1.50 and better still less than or equal to 1.45. Unless otherwise indicated, the refractive indices to which reference is made in the present invention are expressed at 25° C. for a wavelength of 550 nm.

The HI layers are conventional high-refractive-index layers, well known in the art. They generally comprise one or more mineral oxides, such as, without limitation, zirconia ($ZrO_2$), titanium dioxide ($TiO_2$), tantalum pentoxide ($Ta_2O_5$), neodymium oxide ($Nd_2O_5$), hafnium oxide ($HfO_2$), praseodymium oxide ($Pr_2O_3$), praseodymium titanate ($PrTiO_3$), $La_2O_3$, $Nb_2O_5$, $Y_2O_3$, indium oxide $In_2O_3$ or tin oxide $SnO_2$. Preferred materials are $TiO_2$, $Ta_2O_5$, $PrTiO_3$, $ZrO_2$, $SnO_2$, $In_2O_3$ and mixtures thereof.

The LI layers are also well known and can comprise, without limitation, $SiO_2$, $MgF_2$, $ZrF_4$, alumina ($Al_2O_3$) in a small proportion, $AlF_3$, and mixtures thereof, preferably $SiO_2$. Use may also be made of SiOF (fluorine-doped $SiO_2$) layers.

Generally, the HI layers have a physical thickness varying from 10 to 120 nm and the LI layers have a physical thickness varying from 10 to 120 nm, preferably from 10 to 110 nm.

The total thickness of the interference coating is preferably less than 1 micrometer, better still less than or equal to 800 nm and even better still less than or equal to 500 nm. The total thickness of the interference coating is generally greater than 100 nm, preferably greater than 150 nm.

More preferably, the interference coating, which is preferably an antireflective coating, comprises at least two low-refractive-index (LI) layers and at least two high-refractive-index (HI) layers. The total number of layers in the interference coating is preferably less than or equal to 8 and better still less than or equal to 6.

It is not necessary for the HI and LI layers to alternate in the interference coating, although they can according to one embodiment of the invention. Two (or more) HI layers can be deposited on one another, just as two (or more) LI layers can be deposited on one another.

According to the invention, the layers L generally constitute low-refractive-index layers. The interference coating according to the invention may contain one or more layers L. According to one embodiment of the invention, the layers L constitute all of the low-refractive-index layers of the interference coating.

In a first embodiment, all the low-refractive-index layers of the interference coating are layers L.

In another embodiment of the invention, all the low-refractive-index layers of the interference coating according to the invention are of inorganic nature except for a layer L 38 (that is to say that the other low-refractive-index layers of the interference coating preferably do not contain an organic compound).

Preferably, all the layers of the interference coating according to the invention are of inorganic nature except for the layer L 38, which means that the layer L 38 preferably constitutes the only layer of organic-inorganic nature of the interference coating of the invention (the other layers of the interference coating preferably not containing an organic compound).

Preferably, the layer L 38 constitutes the external layer of the interference coating.

According to one embodiment of the invention, the interference coating comprises a sublayer. It constitutes in this case generally the first layer of this interference coating in the order of deposition of the layers, that is to say the layer of the interference coating which is in contact with the subjacent coating (which is generally an abrasion-resistant and/or scratch-resistant coating) or with the substrate, when the interference coating is deposited directly on the substrate.

"Sublayer of the interference coating" is understood to mean a relatively thick coating used with the aim of improving the abrasion resistance and/or scratch resistance of said coating and/or to promote its adhesion to the substrate or to the subjacent coating. The sublayer according to the invention can be chosen from the sublayers described in the application WO-2010/109154. Preferably, the sublayer has a thickness of 100 to 500 nm. In another embodiment of the invention, the sublayer has a thickness of 150 to 400 nm, preferably of 150 to 300 nm. It is preferentially of exclusively mineral/inorganic nature and is preferentially formed of silica $SiO_2$.

The article of the invention can be rendered antistatic by virtue of the incorporation, preferably in the interference coating, of at least one electrically conductive layer. "Antistatic" is understood to mean the property of not retaining and/or developing an appreciable electrostatic charge. An article is generally considered as having acceptable antistatic properties when it does not attract and hold dust and small particles after one of its surfaces has been rubbed with an appropriate cloth.

The nature and the location in the stack of the electrically conductive layer which can be used in the invention are described in more detail in the application WO-2013/098531. It is preferably a layer with a thickness of 1 to 20 nm preferably comprising at least one metal oxide chosen from indium tin oxide ($In_2O_3$:Sn, tin-doped indium oxide, denoted ITO), indium oxide ($In_2O_3$) and tin oxide ($SnO_2$).

The various layers of the interference coating (of which the optional antistatic layer L forms part), other than the layer(s) L, are preferably deposited by vacuum deposition according to one of the following techniques: i) by evaporation, optionally ion beam-assisted evaporation, ii) by ion beam sputtering, iii) by cathode sputtering or iv) by plasma-enhanced chemical vapor deposition. These various techniques are described in the works "Thin Film Processes" and "Thin Film Processes II", Vossen and Kern, Eds., Academic Press, 1978 and 1991, respectively. A particularly recommended technique is the vacuum evaporation technique. Preferably, each of the layers of the interference coating is deposited by vacuum evaporation.

The layer L 38 generally constitutes a low-refractive-index layer within the meaning of the invention as a result of its refractive index of less than or equal to 1.47. Preferably, according to embodiments of the invention, the refractive index of the layer L 38 varies from 1.38 to 1.47. It should be noted that the refractive index of the layer L 38 is measured at the wavelength of 632.8 nm at a temperature T=20-25° C.

Refractive index ranges corresponding to other embodiments of the invention are the following ranges:
1.38 to 1.45; 1.38 to 1.44, 1.38 to 1.43; 1.38 to 1.42.

The layer L 38 is formed of a material obtained by vacuum deposition, by co-evaporation, of at least one alkaline-earth metal fluoride, preferably $MgF_2$ and of at least one organosilicon compound B.

Preferably, the deposition is carried out in a vacuum chamber comprising an ion gun directed toward the substrates to be coated, which emits, toward said substrates, a beam of positive ions generated in a plasma within the ion gun. Preferably, the ions resulting from the ion gun are particles consisting of gas atoms from which one or more electron(s) have been stripped and which are formed from a noble gas, oxygen, nitrogen or a mixture of two or more of these gases.

The organosilicon compound B, precursor of the layer L 38 is introduced in or pass into a gaseous state in the vacuum chamber. They are preferably conveyed in the direction of the ion beam and are activated under the effect of the ion gun.

This deposition technique using an ion gun and a gaseous precursor, sometimes denoted by "ion beam deposition", is described in particular, with only organic precursors, in U.S. Pat. No. 5,508,368.

According to the invention, preferably, the only place in the chamber where a plasma is generated is the ion gun.

The ions may, if required, be neutralized before they exit the ion gun. In this case, the bombardment will still be regarded as being ion bombardment. The ion bombardment causes an atomic rearrangement in and a densification of the layer being deposited, which makes it possible to tamp it down while it is in the course of being formed.

During the implementation of the process according to the invention, the surface to be treated is preferably bombarded by ions with a current density generally of between 20 and 1000 $\mu A/cm^2$, preferably between 30 and 500 $\mu A/cm^2$ and better still between 30 and 200 $\mu A/cm^2$, over the activated surface, and generally under a residual pressure in the vacuum chamber which can range from $6\times10^{-5}$ mbar to $5\times10^{-4}$ mbar and preferably from $8\times10^{-5}$ mbar to $5\times10^{-4}$ mbar. Use is preferably made of a beam of oxygen ions, argon ions, nitrogen ions or ions of a mixture of two or more of these gases. When a mixture of argon and oxygen is employed, the $Ar/O_2$ molar ratio is preferably 1, better still ≤0.75 and even better still ≤0.5. This ratio can be controlled by adjusting the gas flow rates in the ion gun. The flow rates of the gases preferably vary from 0 to 30 sccm.

The ions of the ion beam, preferentially resulting from an ion gun, used during the deposition of the layer L 38 preferably have an energy ranging from 5 eV to 1000 eV, better still from 5 to 500 eV, preferentially from 75 to 150 eV, preferentially from 80 to 140 eV and better still from 90 to 110 eV. The activated species formed are typically radicals or ions.

In the event of ion bombardment during the deposition, it is possible to carry out a plasma treatment concomitantly or nonconcomitantly with the deposition under an ion beam of the layer L 38. In another embodiment, the layer is preferably deposited without the assistance of a plasma at the level of the substrates.

Said layer L 38 is deposited in the presence of an oxygen source when the compound B does not contain (or does not contain enough) oxygen atoms and when it is desired for the layer L 38 to contain a certain proportion of oxygen. Likewise, said layer L 38 is deposited in the presence of a nitrogen source when the compound B does not contain (or does not contain enough) nitrogen atoms and when it is desired for the layer L 38 to contain a certain proportion of nitrogen.

Generally, it is preferable to introduce oxygen gas with, if appropriate, a low content of nitrogen gas, preferably in the absence of nitrogen gas.

Besides the layer L 38, other layers of the interference coating can be deposited under ion bombardment 40 as described above, that is to say by using bombardment by means of an ion beam of the layer being formed, which beam is preferably emitted by an ion gun 42.

The preferred method for the vaporization of the precursor materials of the layer L 38, carried out under vacuum, is physical vapor deposition, in particular vacuum evaporation, generally combined with a heating of the compounds to be evaporated. It can be deployed by using evaporation systems as diverse as a Joule-effect heat source (the Joule effect is the thermal manifestation of the electrical resistance) or an electron gun for the liquid or solid precursors, it being possible for any other device known to a person skilled in the art to also be used.

The compound B, precursor of the layer L 38 is preferably introduced in gaseous form into the vacuum chamber in which the articles according to the invention are prepared, while controlling its flow rate. This means that it is preferably not vaporized inside the vacuum chamber (in contrast to the alkaline-earth metal fluoride). The feed of the compound B, precursor of the layer L 38 is located at a distance from the outlet of the ion gun preferably varying from 30 to 50 cm.

Preferably, the alkaline-earth metal fluoride, in particular $MgF_2$, is preheated so as to be in a molten state then evaporated. It is preferably deposited by vacuum evaporation using an electron gun in order to bring about its vaporization.

The precursors: compound B and the metallic compound A, typically $MgF_2$, are preferably deposited concomitantly (for example by co-evaporation) or partially concomitantly, that is to say with overlapping of the stages of deposition of the two precursors. In the latter case, the deposition of one of the two precursors begins before the deposition of the other, the deposition of the second precursor beginning before the end of the deposition of the first precursor.

The organosilicon compound B, precursor of the layer L 38, is of organic nature and contains, in its structure, at least one silicon atom and at least one carbon atom. It preferably comprises at least one Si—C bond and preferably comprises at least one hydrogen atom. According to one embodiment, the compound B comprises at least one nitrogen atom and/or at least one oxygen atom, preferably at least one oxygen atom.

The concentration of each chemical element (Ti, Si, O, C, H, N, etc.) in the layer L 38 can be determined using the RBS (Rutherford Backscattering Spectrometry) technique and ERDA (Elastic Recoil Detection Analysis).

The following compounds are nonlimiting examples of cyclic or noncyclic organic compounds B: octamethylcyclotetrasiloxane (OMCTS), decamethylcyclopentasiloxane, dodecamethylcyclohexasiloxane, hexamethylcyclotrisiloxane, hexamethyldisiloxane (HMDSO), octamethyltrisiloxane, decamethyltetrasiloxane (DMTS), dodecamethylpentasiloxane, tetraethoxysilane, vinyltrimethylsilane, hexamethyldisilazane, hexamethyldisilane, hexamethylcyclotrisilazane, vinylmethyldiethoxysilane, divinyltetramethyldisiloxane, tetramethyldisiloxane, polydimethylsiloxane (PDMS), polyphenylmethylsiloxane (PPMS) or a tetraalkylsilane, such as tetramethylsilane.

Preferably, the compound B comprises at least one silicon atom bearing at least one alkyl group, preferably a $C_1$-$C_4$ alkyl group, better still at least one silicon atom bearing one or two identical or different alkyl groups, preferably $C_1$-$C_4$ alkyl groups, for example the methyl group.

The preferred compounds B, precursor of the layer L 38 comprise an Si—O—Si group, better still a divalent group of formula (3):

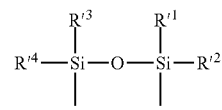

where $R'^1$ to $R'^4$ independently denote linear or branched alkyl or vinyl groups, preferably $C_1$-$C_4$ groups, for example the methyl group, monocyclic or polycyclic aryl groups, the hydroxyl groups or hydrolysable groups. Nonlimiting examples of hydrolysable groups are the following groups: H, halogen (chloro, bromo, iodo, etc.), alkoxy, aryloxy, acyloxy, —$NR^1R^2$, where $R^1$ and $R^2$ independently denote a hydrogen atom, an alkyl group or an aryl group, and —$N(R^3)$—Si, where $R^3$ denotes a hydrogen atom, a linear or branched alkyl group, preferably a $C_1$-$C_4$ alkyl group, or a monocyclic or polycyclic aryl group, preferably a monocyclic aryl group. Groups comprising an Si—O—Si chain member are not considered to be "hydrolysable groups" within the meaning of the invention. The preferred hydrolysable group is the hydrogen atom.

According to another embodiment, the compound B precursor of the layer L 38 corresponds to the formula:

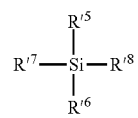

in which $R'^5$, $R'^6$, $R'^7$ and $R'^8$ independently denote hydroxyl groups or hydrolysable groups, such as OR groups, in which R is an alkyl group.

According to a first embodiment, the compound B comprises at least one silicon atom bearing two identical or different alkyl groups, preferably $C_1$-$C_4$ alkyl groups. According to this first embodiment, the compound B is preferably a compound of formula (3) in which $R'^1$ to $R'^4$ independently denote alkyl groups, preferably $C_1$-$C_4$ alkyl groups, for example the methyl group.

Preferably, the silicon atom or atoms of the compound B do not comprise any hydrolysable group or hydroxyl group in this embodiment.

The silicon atom or atoms of the compound B, precursor of the layer L 38, are preferably solely bonded to alkyl groups and/or groups comprising an —O—Si or —NH—Si chain member, so as to form an Si—O—Si or Si—NH—Si group. The preferred precursor compounds of the layer L 38 are DMTS, OMCTS and HMDSO.

It is preferably a cyclic polysiloxane of formula (4):

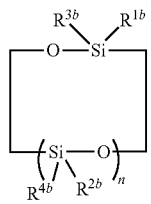

where n designates an integer ranging from 2 to 20, preferably from 3 to 8, and Rib to Rob independently represent linear or branched alkyl groups, preferably $C_1$-$C_4$ alkyl groups (for example the methyl group), vinyl groups, aryl groups or a hydrolysable group. The preferred members belonging to this group are the octaalkylcyclotetrasiloxanes (n=3), preferably octamethylcyclotetrasiloxane (OMCTS). In some cases, the layer L 38 results from a mixture of a certain number of compounds of formula (4), where n can vary within the limits indicated above.

According to a second embodiment, the compound B contains, in its structure, at least one Si—X' group, where X' is a hydroxyl group or a hydrolysable group, which can be chosen, without limitation, from the following groups: H, halogen, alkoxy, aryloxy, acyloxy, —$NR^1R^2$, where $R^1$ and $R^2$ independently denote a hydrogen atom, an alkyl group or an aryl group, and —$N(R^3)$—Si, where $R^3$ denotes a hydrogen atom, an alkyl group or an aryl group.

According to this second embodiment of the invention, the compound B preferably contains, in its structure, at least one Si—H group, that is to say constitutes a silicon hydride. Preferably, the silicon atom of the Si—X' group is not bonded to more than two non-hydrolysable groups, such as alkyl or aryl groups.

Among the X' groups, the acyloxy groups preferably have the formula —O—C(O)$R^4$, where $R^4$ is an aryl group, preferably a $C_6$-$C_{12}$ aryl group, optionally substituted by one or more functional groups, or an alkyl group, preferably a linear or branched $C_1$-$C_6$ alkyl group, optionally substituted by one or more functional groups and additionally being able to comprise one or more double bonds, such as the phenyl, methyl or ethyl groups, the aryloxy and alkoxy groups have the formula —O—$R^5$, where $R^5$ is an aryl group, preferably a $C_6$-$C_{12}$ aryl group, optionally substituted by one or more functional groups, or an alkyl group, preferably a linear or branched $C_1$-$C_6$ alkyl group, optionally substituted by one or more functional groups and additionally being able to comprise one or more double bonds, such as the phenyl, methyl or ethyl groups, the halogens are preferably F, Cl, Br or I, the X' groups of formula —$NR^1R^2$ can denote an amino $NH_2$, alkylamino, arylamino, dialkylamino or diarylamino group, $R^1$ and $R^2$ independently denoting a hydrogen atom, an aryl group, preferably a $C_6$-$C_{12}$ aryl group, optionally substituted by one or more functional groups, or an alkyl group, preferably a linear or branched $C_1$-$C_6$ alkyl group, optionally substituted by one or more functional groups and additionally being able to comprise one or more double bonds, such as the phenyl, methyl or ethyl groups, the X' groups of formula —$N(R^3)$—Si are attached to the silicon atom via their nitrogen atom and their silicon atom naturally comprises three other substituents, where $R^3$ denotes a hydrogen atom, an aryl group, preferably a $C_6$-$C_{12}$ aryl group, optionally substituted by one or more functional groups, or an alkyl group, preferably a linear or branched $C_1$-$C_6$ alkyl group, optionally substituted by one or more functional groups and additionally being able to comprise one or more double bonds, such as the phenyl, methyl or ethyl groups.

The preferred acyloxy group is the acetoxy group. The preferred aryloxy group is the phenoxy group. The preferred halogen group is the Cl group. The preferred alkoxy groups are the methoxy and ethoxy groups.

In the second embodiment, the compound B preferably comprises at least one silicon atom bearing at least one alkyl group, preferably a linear or branched $C_1$-$C_4$ alkyl group, better still at least one silicon atom bearing one or two identical or different alkyl groups, preferably $C_1$-$C_4$ alkyl groups, and an X' group (preferably a hydrogen atom) directly bonded to the silicon atom, X' having the meaning indicated above. The preferred alkyl group is the methyl group. The vinyl group can also be used instead of an alkyl group. Preferably, the silicon atom of the Si—X' group is directly bonded to at least one carbon atom.

Preferably, each silicon atom of the compound B is not directly bonded to more than two X' groups, better still is not directly bonded to more than one X' group (preferably a hydrogen atom) and better still each silicon atom of the compound B is directly bonded to a single X' group (preferably a hydrogen atom). Preferably, the compound B comprises an Si/O atomic ratio equal to 1. Preferably the compound B comprises a C/Si atomic ratio <2, preferably 1.8, better still 1.6 and even better still 1.5, 1.3 and optimally equal to 1. Again preferably, the compound B comprises a C/O atomic ratio equal to 1. According to one embodiment, the compound B does not comprise an Si—N group and better still does not comprise a nitrogen atom.

The silicon atom or atoms of the compound B, precursor of the layer L 38, are preferably solely bonded to alkyl or hydrogen groups, and/or groups comprising an —O—Si or —NH—Si chain member, so as to form an Si—O—Si or Si—NH—Si group. In one embodiment, the compound B comprises at least one Si—O—Si—X' group or at least one Si—NH—Si—X' group, X' having the meaning indicated above and preferably representing a hydrogen atom.

According to this second embodiment, the compound B is preferably a compound of formula (3) in which at least one of $R^{t1}$ to $R^{t4}$ denotes an X' group (preferably a hydrogen atom), X' having the meaning indicated above.

According to this second embodiment, the compound B is preferably a cyclic polysiloxane of formula (5):

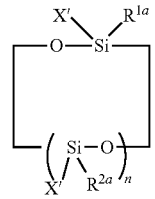

where X' has the meaning indicated above and preferably represents a hydrogen atom, n designates an integer ranging from 2 to 20, preferably from 3 to 8, and $R^{1a}$ and $R^{2a}$ independently represent an alkyl group, preferably a $C_1$-$C_4$ alkyl group (for example the methyl group), vinyl group, aryl group or a hydrolysable group.

Nonlimiting examples of hydrolysable X' groups are the chloro, bromo, alkoxy, acyloxy, aryloxy and H groups. The commonest members belonging to this group are the tetra-, penta- and hexaalkylcyclotetrasiloxanes, preferably the tetra-, penta- and hexamethylcyclotetrasiloxanes, 2,4,6,8- tetramethylcyclotetrasiloxane (TMCTS) being the preferred compound. In some cases, the layer L 38 results from a mixture of a certain number of compounds having the above formula, where n can vary within the limits indicated above.

According to another embodiment, the compound B is a linear alkylhydrosiloxane, better still a linear methylhydrosiloxane, such as, for example, 1,1,1,3,5,7,7,7-octamethyltetrasiloxane, 1,1,1,3,5,5,5-heptamethyltrisiloxane or 1,1,3,3,5,5-hexamethyltrisiloxane.

The following compounds are nonlimiting examples of cyclic or noncyclic organic compounds B, precursor of the layer L 38, in accordance with the second embodiment: 2,4,6,8-tetramethylcyclotetrasiloxane (TMCTS of formula (1)), 2,4,6,8-tetraethylcyclotetrasiloxane, 2,4,6,8-tetraphenylcyclotetrasiloxane, 2,4,6,8-tetraoctylcyclotetrasiloxane, 2,4,6,6,8-hexamethylcyclotetrasiloxane, 2,4,6-trimethylcyclotrisiloxane, cyclotetrasiloxane, 1,3,5,7,9-pentamethylcyclopentasiloxane, 2,4,6,8,10-hexamethylcyclohexasiloxane, 1,1,1,3,5,7,7,7-octamethyltetrasiloxane, 1,1,3,3,5,5-hexamethyltrisiloxane, tetramethyldisiloxane, tetraethoxysilane, vinylmethyldiethoxysilane, a hexamethylcyclotrisilazane, such as 3,4,5,6-hexamethylcyclotrisilazane or 2,2,4,4,6,6-hexamethylcyclotrisilazane, 1,1,1,3,5,5,5-heptamethyltrisiloxane, tris(trimethylsiloxy)silane (of formula (2)), 1,1,3,3-tetramethyldisilazane, 1,2,3,4,5,6,7,8-octamethylcyclotetrasilazane, nonamethyltrisilazane, tris(dimethylsilyl)amine or hexamethyldisilazane.

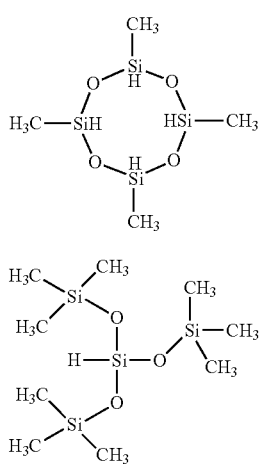

The alkaline-earth metal fluoride of the layer L 38 is preferably magnesium fluoride $MgF_2$.

The use of at least one compound B to form the layer L 38, which comprises in particular Si—C and optionally Si—O bonds, makes it possible to benefit from improved thermomechanical properties with respect to the conventional low-refractive-index materials, such as $SiO_2$ or $MgF_2$; in particular, the thermal resistance and the scratch resistance of the substrates coated with the layers L according to the invention make it possible to achieve levels hitherto inaccessible by the conventional technologies, such as the ion-assisted deposition of purely inorganic layers.

According to one embodiment of the invention, the layer L 38 comprises more than 80% by weight, preferably more than 90% by weight, of compounds resulting from the compound B and the alkaline-earth metal fluoride according to the invention, with respect to the total weight of the layer L 38. According to one embodiment, the layer L 38 is exclusively formed by vacuum deposition under ion bombardment 40 of at least one alkaline-earth metal fluoride and of at least one organosilicon compound B, with the exclusion of any other precursor.

Preferably, the layer L 38 does not comprise a separate metal oxide phase. As the layer L 38 is formed by vacuum deposition, it does not comprise organosilicon compound hydrolysate and thus differs from the sol-gel coatings obtained by the liquid route.

The duration of the deposition process, the flow rates and the pressures are adjusted so as to obtain the desired coating thickness.

The layer L 38 has a thickness ranging up to 300 nm, and preferably from 20 to 150 nm, better still from 25 to 120 nm and even better still from 60 to 100 nm.

The nature of the compounds employed, their respective amounts (which can be modulated by adjusting the flows evaporated) and the duration of the deposition are examples of parameters which a person skilled in the art will know how to vary in order to arrive at the coating having the desired properties, in particular with the help of the examples of the present application.

The articles according to the invention exhibit a good fracture resistance.

Thus, the critical temperature of a coated article according to the invention is preferably greater than or equal to 70° C., better still greater than or equal to 80° C. and even better still greater than or equal to 90° C. In the present application, the critical temperature of an article or a coating is defined as being the temperature starting from which cracks are observed to appear in the stack present at the surface of the substrate, which is the result of degradation of the coating. This high critical temperature is due to the presence of the layer L at the surface of the article, as demonstrated in the experimental section. Furthermore, the layers L obtained possess a poorer ability to become loaded with water than evaporated inorganic layers. The layers L obtained according to the invention, optionally incorporated in an interference coating, have an excellent stability of their optical properties over time.

By virtue of its improved thermomechanical properties, the layer L, optionally forming part of an interference coating, can in particular be applied to a single face of a semi-finished lens, generally its front face, the other face of this lens still having to be machined and treated. The stack present on the front face of the lens will not be degraded by the increase in temperature generated by the treatments to which the back face will be subjected during the curing of the coatings which will have been deposited on this back face or any other action liable to increase the temperature of the lens.

According to a preferred embodiment, the interference coating of the invention is an antireflective coating comprising, in the order of deposition on the surface of the optionally coated substrate, a $ZrO_2$ layer which is generally from 10 to 40 nm in thickness and preferably from 15 to 35 nm in thickness, an $SiO_2$ layer which is generally from 10 to 40 nm in thickness and preferably from 15 to 35 nm in thickness, a layer L which is generally from 40 to 150 nm in thickness and preferably from 50 to 120 nm in thickness, an ITO or $SnO_2$ layer which is generally from 1 to 15 nm in thickness and preferably from 2 to 10 nm in thickness, and an $SiO_2$ layer which is generally from 50 to 150 nm in thickness and preferably from 60 to 100 nm in thickness.

In one embodiment of the invention, the average reflection factor in the visible range (400-700 nm) of an article coated with an interference coating according to the invention, denoted $R_m$, is less than 2.5% per face, better still less than 2% per face and even better still less than 1% per face of the article. In an optimal embodiment, the article comprises a substrate, the two main surfaces of which are coated with an interference coating according to the invention and which exhibits a total $R_m$ value (cumulative reflection due to both faces) of less than 1%. Means for achieving such $R_m$ values are known to a person skilled in the art.

In another embodiment of the invention, the light reflection factor $R_v$ of an interference coating according to the invention is less than 2.5% per face, preferably less than 2% per face, better still less than 1% per face of the article, better still 0.75% and even better still 0.5%.

In the present application, the "average reflection factor" $R_m$ (average of the spectral reflection over the entire visible spectrum between 400 and 700 nm) and the light reflection factor $R_v$ are as defined in the standard ISO 13666:1998 and are measured according to the standard ISO 8980-4.

In some applications, it is preferable for the main surface of the substrate to be coated with one or more functional coatings prior to the deposition of the layer L or of the multilayer coating comprising the layer L. These functional coatings conventionally used in optics can be, without limitation, a primer layer which improves the impact strength and/or the adhesion of the subsequent layers in the final product, an abrasion-resistant and/or scratch-resistant coating, a polarized coating, a photochromic or electrochromic coating or a colored coating, in particular a primer layer coated with an abrasion-resistant and/or scratch-resistant layer L. The latter two coatings are described in more detail in the applications WO-2008/015364 and WO-2010/109154 and EP 614 957.

The article according to the invention can also comprise coatings, formed on the layer L or the multilayer coating comprising it, capable of modifying its surface properties, such as a hydrophobic and/or oleophobic coating (antismudge top coat) or an anti-fogging coating. These coatings are preferably deposited on the layer L or the external layer of an interference coating. They are generally less than or equal to 10 nm in thickness, preferably from 1 to 10 nm in thickness and better still from 1 to 5 nm in thickness. They are described in the applications WO-2009/047426 and WO-2011/080472 respectively.

Hydrophobic and/or oleophobic coatings are defined as coatings, the static contact angle with deionized water of which is greater than or equal to 75°, preferably greater than or equal to 90° and better still greater than or equal to 100°. In the present application, the static contact angles can be determined according to the liquid drop method, according to which a liquid drop having a diameter of less than 2 mm is deposited gently on a non-absorbent solid surface and the angle at the interface between the liquid and the solid surface is measured.

The hydrophobic and/or oleophobic coating is preferably a coating of fluorosilane or fluorosilazane type. It can be obtained by deposition of a fluorosilane or fluorosilazane precursor, preferably comprising at least two hydrolysable groups per molecule. The fluorosilane precursors preferably contain fluoropolyether groups and better still perfluoropolyether groups.

Preferably, the external hydrophobic and/or oleophobic coating has a surface energy equal to or less than 14 mJ/m$^2$, preferably equal to or less than 13 mJ/m$^2$, better still equal to or less than 12 mJ/m$^2$. The surface energy is calculated using the Owens-Wendt method described in the article: "Estimation of the surface force energy of polymers", Owens D. K. and Wendt R. G. (1969), J. Appl. Polym. Sci., 13, 1741-1747. The liquids used are water and diiodomethane.

Compounds which can be used to obtain such coatings are described in the patents JP 2005187936 and U.S. Pat. No. 6,183,872. Commercially available compositions which make it possible to prepare hydrophobic and/or oleophobic coatings are the composition KY130® from Shin-Etsu Chemical or the composition OPTOOL DSX® sold by Daikin Industries.

Preferentially, an article according to the invention comprises a substrate successively coated with an adhesion and/or impact-resistant primer layer, with an abrasion-resistant and/or scratch-resistant coating, with an optionally antistatic interference coating comprising a layer L according to the invention, and with a hydrophobic and/or oleophobic coating.

The invention is illustrated in a nonlimiting way by the following examples. Unless otherwise indicated, the refractive indices are given for a wavelength of 632.8 nm and T=20-25° C.

EXAMPLES

1. General Procedures

The articles employed in the examples comprise an Orma® Essilor lens substrate with a diameter of 65 mm, with a power of −2.00 dioptres and with a thickness of 1.2 mm, coated on its concave face with the impact-resistant primer coating and with the abrasion-resistant and scratch-resistant coating (hard coat), which are disclosed in the experimental section of the application WO-2010/109154, and a layer L according to the invention.

In example 4 and comparative example no. 2, the above articles are additionally coated with an antireflective coating comprising, in order, starting from the abrasion-resistant and scratch-resistant coating, a $ZrO_2$ layer (30 nm), an $SiO_2$ layer (30 nm), a $ZrO_2$ layer (70 nm) and an ITO layer (5 nm), the layer L or an $MgF_2$ layer being deposited directly on the ITO layer, a thin organic-inorganic layer optionally being deposited on the layer L.

The vacuum deposition reactor is a Leybold LH1100+ machine equipped with an electron gun for the evaporation of the precursor materials, with a thermal evaporator, with a KRI EH 1000 F ion gun (from Kaufman & Robinson Inc.), for the preliminary phase of optional preparation of the surface of the substrate by argon ions (IPC) and also for the deposition of the layer L under ion bombardment (IAD), and with a system for the introduction of vapor, which system is used when the precursor compound of the layer L is a liquid under standard temperature and pressure conditions (case of DMTS). This system comprises a tank containing the liquid precursor compound of the layer L, resistive heaters for heating the reservoir, and tubes connecting the reservoir of liquid precursor to the vacuum deposition machine, and a vapor flowmeter from MKS (MKS1150C).

The DMTS vapor exits from a copper pipe inside the machine, at a distance of about 30 cm from the ion gun. Flows of oxygen and/or argon and/or nitrogen are introduced into the ion gun.

The layers L according to the invention are formed by ion-beam-assisted vacuum evaporation during the deposition (evaporation source: electron gun) of decamethyltetrasiloxane, supplied by Sigma-Aldrich and of a magnesium fluoride.

The optional thin organic-inorganic layer 36 is also formed by ion-beam-assisted vacuum evaporation during the deposition of decamethyltetrasiloxane.

Unless otherwise indicated, the thicknesses mentioned are physical thicknesses. Several samples of each lens were prepared.

2. Procedures

The process for the preparation of the optical articles coated with a layer L according to the invention comprises the introduction of the substrate, coated with the primer coating and with the abrasion-resistant coating (substrate no. 1) and optionally with the antireflective coating (substrate no. 2) which are defined above, into the vacuum deposition chamber; the preheating of the tank, the pipes and the vapor flowmeter to the chosen temperature (~15 min), a primary pumping stage, then a secondary pumping stage for 400 seconds making it possible to obtain a high vacuum (~2× $10^{-5}$ mbar, pressure read from a Bayard-Alpert gauge), an optional stage of activation of the surface of the substrate by a beam of argon ions (IPC: 1 minute, 100 V, 1 A, the ion gun remaining in operation at the end of this stage) and then the deposition by evaporation of the layer L, carried out in the following way.

Since the ion gun was started with argon, oxygen and/or nitrogen are/is added to the ion gun with a programmed flow rate, the desired anode current (2-3 A) is programmed and the argon flow is optionally halted, depending on the deposition conditions desired.

The magnesium fluoride is preheated so as to be in a molten state and then evaporated using an electron gun, the shutter of the ion gun and that of the electron gun being opened simultaneously. At the same time, the DMTS compound is introduced into the chamber in gaseous form, at a controlled flow rate or partial pressure.

A thin organic-inorganic layer is deposited under similar conditions, but without co-evaporation of $MgF_2$.

The thickness of the layers deposited was controlled in real time by means of a quartz microbalance, the rate of deposition being modified, if need be, by adjusting the current of the electron gun. Once the desired thickness has been obtained, the two shutters are closed, the ion and electron guns are switched off and the gas flows (oxygen, nitrogen, optionally argon and DMTS vapors) are halted.

Finally, a venting stage is carried out.

The precise parameters of the process for forming the layer L and the thin organic-inorganic layer (examples according to the invention) and the sole $MgF_2$ layer (comparative examples) are given in table I below.

3. Characterizations

Critical Temperature

The critical temperature of the article is measured 24 hours or one week after its preparation, in the following way:

The coated ophthalmic organic lens is placed in an oven thermostatically maintained at a temperature T of 50° C. for 1 hour, removed from the oven and then the visual appearance of the article is evaluated in reflection under a desk lamp. If the coating appears intact, the ophthalmic organic lens is placed back in the oven for 1 hour at the temperature T+10° C. As soon as the coating appears cracked, the test is stopped. The critical temperature corresponds to the crack appearance temperature.

Refractive Index

The refractive index measurements were carried out at the wavelength of 632.8 nm, unless otherwise indicated, by ellipsometry. More specifically, the refractive index is obtained by an ellipsometric measurement using an ellipsometer (RC2, J. A. Woollam) equipped with a dual rotating compensator. The refractive index is deduced from the dispersion relationship which models the optical response provided by the ellipsometric angles $\Psi$ and $\Delta$. For dielectric materials, such as $MgF_2$, the Tauc-Lorentz equation, known to a person skilled in the art, models well the optical properties of the layers deposited. All the measurements were carried out at angles of incidence of 45°, 55°, 65° and 75° in a range of wavelengths of 190-1700 nm.

The adhesion properties of the whole of the interference coating adhering to the substrate were verified on the convex face of the lens by means of the "n×10 rubs" test, following the procedure described in international patent applications WO 2010/109154 and WO 99/49097. The test consists in noting the number of cycles that a lens was able to be subjected to before the appearance of a defect. Therefore, the higher the value obtained in the n×10 rubs test, the better the adhesion of the interference coating to the substrate.

The abrasion resistance of the article was evaluated by determining Bayer ASTM (Bayer sand) values for the substrates coated with the antireflective coating, using the methods described in application WO 2008/001011 (standard ASTM F 735.81). The higher the value obtained in the Bayer test, the higher the abrasion resistance. Thus, the Bayer ASTM (Bayer sand) value is deemed to be good when it is greater than or equal to 3.4 and less than 4.5 and excellent for values of 4.5 or more.

TABLE I

| | | Layer deposited | | | Ion assistance | | | | DMTS * |
|---|---|---|---|---|---|---|---|---|---|
| Example | Substrate | Nature of the layer | Thickness (nm) | Deposition rate (nm/s) | Current intensity (A) | Gas flow rate (sccm) $O_2$ | Ar | $N_2$ | flow rate (sccm) |
| 1 | no. 1 | L | 300 | 2 | 3 | 20 | 0 | 0 | 20 |
| 2 | no. 1 | L | 300 | 2 | 2 | 0 | 0 | 20 | 20 |
| 3 | no. 1 | L | 300 | 2 | 3 | 0 | 20 | 20 | 20 |
| 4 | no. 2 | L | 80 | 2 | 3 | 20 | 0 | 0 | 20 |
| | | organic-inorganic layer | 5 | 2 | 3 | 20 | 0 | 0 | 20 |
| C1 | no. 1 | $MgF_2$ | 300 | 2 | 3 | 20 | 10 | 0 | — |
| C2 | no. 2 | $MgF_2$ | 80 | 2 | 3 | 20 | 0 | 0 | — |

* decamethyltetrasiloxane

4. Results

The optical and mechanical performance of various articles, according to the invention or comparative, and also the conditions for the deposition of the various layers are presented in table II below.

TABLE II

| Examples | Refractive index at 632.8 nm | Critical temperature (° C.) T +24 h | Critical temperature (° C.) T +1 week | Bayer sand | n × 10 rubs test Cc/Cx |
|---|---|---|---|---|---|
| 1 | 1.41-1.42 | — | 120 | — | — |
| 2 | 1.39-1.41 | — | 110-120 | — | — |
| 3 | 1.37-1.40 | — | 120 | — | — |
| 4 | — | 70 | — | 5.5-6.7 | 13/13 |
| C1 | 1.37-1.38 | — | 50 | — | — |
| C2 | — | 50 | — | 7.0 | 13/13 |

The articles according to invention have a markedly improved critical temperature relative to a layer exclusively composed of $MgF_2$. Moreover, they have an abrasion resistance (example 4) and also mechanical strength properties (Bayer) similar to an $MgF_2$ layer.

The refractive index of the hybrid layers according to the invention has a value very close to that of a low-index layer composed solely of $MgF_2$.

The invention claimed is:

1. A process for the manufacture of an article, comprising at least the following steps:
   supplying an article comprising a substrate having at least one main surface;
   depositing, on said main surface of the substrate, a layer L of a material M having a refractive index ranging from 1.38 to 1.47 at a wavelength of 632.8 nm; and
   recovering the article, wherein said layer L has been obtained by deposition, by co-evaporation, of at least two precursors:
   one metallic compound A chosen from alkaline-earth metal fluorides; and
   at least one organosilicon compound B, the deposition of the organosilicon compound B, in gaseous form, being carried out in the presence of an ion bombardment so as to obtain the material M,
   wherein the process comprises the step of depositing, on said main surface of the substrate, a multilayer interference coating, wherein the layer L constitutes at least one layer of said multilayer interference coating,
   wherein a thin organic-inorganic layer having a thickness of 1 to 20 nm is deposited on this layer L, wherein the thin organic-inorganic layer is a low-index layer which is the external layer of the multilayer interference coating, this organic-inorganic layer being obtained by deposition of an organosilicon compound or a mixture of organosilicon compounds in gaseous form, in the presence of an ion bombardment and in the absence of a mineral precursor, and
   wherein the organosilicon compound B comprises at least one divalent group of formula:

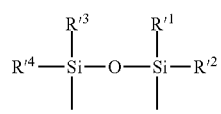

wherein each R'1 to R'4 is independently vinyl, aryl, hydroxyl, or a hydrolysable group, or wherein compound B corresponds to formula:

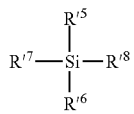

wherein each R'5, R'6, R'7 and R'8 is independently hydroxyl or a hydrolysable OR group, wherein R is an alkyl group.

2. The process according to claim 1, wherein the deposition of the organosilicon compound B is carried out in the presence of an ion bombardment with an ion gun directed toward the substrate, and which emits, toward said substrate, a beam of positive ions generated in a plasma within the ion gun, the compound B being activated under the effect of said ion gun, the ion bombardment causing an atomic rearrangement in and a densification of the material M.

3. The process according to claim 2, wherein the positive ions of the beam used during the deposition of the organosilicon compound B have an energy ranging from 5 eV to 1000 eV.

4. The process according to claim 3, wherein the ion bombardment of the organosilicon compound B is carried out in the presence of a gas chosen from oxygen or a mixture of oxygen and argon and/or nitrogen.

5. The process according to claim 1, wherein the organic compound B does not comprise any fluorocarbon.

6. The process according to claim 1, wherein the organic compound B is formed solely of an organosilicon compound or a mixture of organosilicon compounds.

7. The process according to claim 1, wherein the co-evaporation of the metallic compound A is carried out using an electron gun.

8. The process according to claim 1, wherein the metallic compound A is MgF2.

9. The process according to claim 1, wherein the organosilicon compound B comprises at least one Si—C bond.

10. The process according to claim 1, wherein the compound B is chosen from octamethylcyclotetrasiloxane, 2,4,6,8-tetramethylcyclotetrasiloxane, decamethyltetrasiloxane, decamethylcyclopentasiloxane, dodecamethylpentasiloxane or hexamethyldisiloxane.

11. The process according to claim 1, wherein the silicon atom or atoms of the organosilicon compound B do not comprise any hydrolysable group or hydroxyl group.

12. The process according to claim 1, wherein the multilayer interference coating is an antireflective coating.

13. The process according to claim 1, wherein said thin organic-inorganic layer is obtained solely by deposition of an organosilicon compound or a mixture of organosilicon compounds.

14. The process according to claim 1, wherein the organosilicon compound or mixture of organosilicon compounds used for this thin organic-inorganic layer are the same as those that can be used for the formation of the layer L.

15. The process according to claim 1, wherein the deposition of the thin organic-inorganic layer is carried out in the absence of any mineral precursor.

16. The process according to claim 1, the ion bombardment is performed by ions with a current density generally of between 20 and 1000 µA/cm2 under a residual pressure in a vacuum chamber which ranges from 6×10-5 mbar to 5×10-4 mbar.

17. The process according to claim 1, wherein the thickness of the thin organic-inorganic layer ranges from 1 nm to 10 nm.

\* \* \* \* \*